(12) United States Patent
Troost

(10) Patent No.: US 7,209,217 B2
(45) Date of Patent: Apr. 24, 2007

(54) LITHOGRAPHIC APPARATUS AND DEVICE MANUFACTURING METHOD UTILIZING PLURAL PATTERNING DEVICES

(75) Inventor: Kars Zeger Troost, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 74 days.

(21) Appl. No.: 11/101,635

(22) Filed: Apr. 8, 2005

(65) Prior Publication Data

US 2006/0227311 A1    Oct. 12, 2006

(51) Int. Cl.
    G03B 27/54    (2006.01)
    G03B 27/42    (2006.01)
(52) U.S. Cl. .......................................... 355/67; 355/53
(58) Field of Classification Search ................. 355/53, 355/67, 71, 75; 359/291–292; 43/5, 22, 43/30
    See application file for complete search history.

(56) References Cited

U.S. PATENT DOCUMENTS

| 5,229,872 | A |  | 7/1993 | Mumola |
|---|---|---|---|---|
| 5,296,891 | A |  | 3/1994 | Vogt et al. |
| 5,500,736 | A |  | 3/1996 | Koitabashi et al. |
| 5,523,193 | A |  | 6/1996 | Nelson |
| 5,530,482 | A |  | 6/1996 | Gove et al. |
| 5,579,147 | A |  | 11/1996 | Mori et al. |
| 5,677,703 | A |  | 10/1997 | Bhuva et al. |
| 5,808,797 | A |  | 9/1998 | Bloom et al. |
| 5,982,553 | A |  | 11/1999 | Bloom et al. |
| 6,133,986 | A |  | 10/2000 | Johnson |
| 6,134,008 | A | * | 10/2000 | Nakao ........................ 356/508 |
| 6,177,980 | B1 |  | 1/2001 | Johnson |
| 6,407,766 | B1 | * | 6/2002 | Ramanujan et al. ........ 347/239 |
| 6,611,316 | B2 | * | 8/2003 | Sewell ........................ 355/46 |
| 6,618,185 | B2 | * | 9/2003 | Sandstrom .................. 359/292 |
| 6,687,041 | B1 |  | 2/2004 | Sandstrom |
| 6,747,783 | B1 |  | 6/2004 | Sandstrom |
| 6,795,169 | B2 |  | 9/2004 | Tanaka et al. |
| 6,806,897 | B2 |  | 10/2004 | Kataoka et al. |
| 6,811,953 | B2 |  | 11/2004 | Hatada et al. |
| 6,819,405 | B2 | * | 11/2004 | Mulkens et al. .............. 355/75 |
| 2004/0041104 | A1 |  | 3/2004 | Liebregts et al. |
| 2004/0130561 | A1 |  | 7/2004 | Jain |
| 2005/0007572 | A1 |  | 1/2005 | George et al. |
| 2005/0286035 | A1 | * | 12/2005 | Troost et al. .................. 355/67 |

FOREIGN PATENT DOCUMENTS

| WO | WO 98/33096 | 7/1998 |
|---|---|---|
| WO | WO 98/38597 | 9/1998 |

* cited by examiner

*Primary Examiner*—Henry Hung Nguyen
(74) *Attorney, Agent, or Firm*—Sterne, Kessler, Goldstein & Fox PLLC

(57) ABSTRACT

A lithographic apparatus includes an illumination system, a patterning system, a projection system, and a combining system. The illumination system supplies a beam of radiation. The patterning system patterns the beam. The patterning system includes at least two arrays of individually controllable elements arranged to be illuminated by respective portions of the beam, each of the arrays pattering the respective portion of the beam. The combining system combines the patterned portions into the patterned beam. The projection system projects the patterned beam onto a target portion of a substrate.

22 Claims, 5 Drawing Sheets

LITHOGRAPHIC APPARATUS AND DEVICE MANUFACTURING METHOD UTILIZING PLURAL PATTERNING DEVICES

BACKGROUND

1. Field

The present invention relates to a lithographic apparatus and a device manufacturing method.

2. Related Art

A lithographic apparatus is a machine that applies a desired pattern onto a target portion of a substrate. A lithographic apparatus can be used, for example, in the manufacture of integrated circuits (ICs), flat panel displays, and other devices involving fine structures. In a conventional lithographic apparatus, a patterning device, which is alternatively referred to as a mask or a reticle, can be used to generate a circuit pattern corresponding to an individual layer of the IC (or other device), and this pattern can be imaged onto a target portion (e.g. comprising part of, one or several dies) on a substrate (e.g., a silicon wafer or glass plate) that has a layer of radiation-sensitive material (e.g., resist).

Instead of a mask, the patterning device can comprise an array of individually controllable elements, which generate the circuit pattern. Each individually controllable element can, by way of example, comprise a diffractive device arranged, such that addressed areas of a reflective surface reflect incident light as diffracted light, while unaddressed areas reflect incident light as undiffracted light. Using an appropriate spatial filter, the undiffracted light can be filtered out of the reflected beam, leaving only the diffracted light to reach the substrate.

In general, a single substrate will contain a network of adjacent target portions that are successively exposed. Known types of lithographic apparatus include steppers, in which each target portion is irradiated by exposing an entire pattern onto the target portion in one go, and scanners, in which each target portion is irradiated by scanning the pattern through the beam in a given direction (the "scanning"-direction), while synchronously scanning the substrate parallel or anti-parallel to this direction.

An array of individually controllable elements can be considered to be "dense" if a high proportion of the surface of the array comprises portions, which selectively reflect, diffract or transmit light. Alternatively, an array of individually controllable elements can be considered to be "sparse" if a significant proportion of the surface of the array comprises other structures, for example, drive electronics that do not selectively reflect, diffract or transmit light.

Sparse diffractive arrays, for example a grating light valve (GLV) from Silicon Light Machines of Sunnyvale, Calif., can comprise multiple cells (e.g. an array of about 256×1 cells or about 256×256 cells). Each cell can comprise a plurality of reflective ribbons that can be deformed relative to one another to form a diffraction grating. For example, the height of alternate ribbons can be controlled by drive electronics within the cell. Due to the different fabrication techniques involved in the construction of the ribbons and the drive electronics (e.g., CMOS for the drive electronics and MEMS for the ribbons) it may not be possible to fabricate the ribbons over the drive electronics. Consequently, the drive electronics can form up to about 70% or more of the area of each cell.

For an array having a large number of individually controllable elements, particularly an array having diffractive elements, the total area of the array (alternatively referred to as the die size or chip size) can be very large. It is easier to manufacture arrays having large diffractive elements in sparse arrays, due to the less stringent lithographic requirements. Again, this increases the total surface area of the array.

More cells in an array allows a greater lithographic throughput due to the larger surface area of the substrate that can be exposed in each scan of the lithographic apparatus. Alternatively, an array having a larger number of cells can be designed to have a greater resolution when exposing a single area of substrate. Both of these factors can result in a greater effective pixel throughput for the lithographic apparatus. Therefore, there is an increasing desire to increase the number of cells in the array for each lithographic apparatus.

However, there can be issues involved in increasing the surface area of an array of elements. The larger the surface area of the array, the greater the probability that the array will contain flaws, resulting in the array being unusable. The probability of an array containing a fatal flaw increases exponentially with the surface area of the array as a function of the number of flaws per unit area.

Additionally, in order to fabricate large arrays it may not be possible to expose the entire array in one pass, resulting in a requirement to use a number of separate exposures to fabricate different parts of the array. It is necessary to stitch the multiple optical fields or tiles together to expose the complete circuitry for the array. These additional processing steps can result in a lower throughput and additional cost (due to the larger number of masks and as a result of the reduced throughput) when fabricating an array of individually controllable elements. Furthermore, errors can be introduced when stitching together multiple optical fields, reducing the yield of correctly functioning arrays. A reduction in yield also increases the cost of fabricating large arrays of individually controllable elements.

Consequently, a trade off has to be made between the competing requirements for large cell size, sparse arrays having a large number of cells, and cost, fabrication throughput and yield.

Therefore, what is needed is a system and method for which a size of an effective array of individually controllable elements is increased more efficiently and effectively.

SUMMARY

According to one embodiment of the present invention, there is provided a lithographic apparatus comprising an illumination system, a patterning system, a projection system, and a combining system. The illumination system supplies a beam of radiation. The patterning system patterns the beam. The patterning system comprises at least two arrays of individually controllable elements arranged to be illuminated by respective portions of the beam, each of the arrays pattering the respective portion of the beam. The combining system combines the patterned portions into the patterned beam. The projection system projects the patterned beam onto a target portion of a substrate.

In one example, by using two or more smaller arrays of individually controllable elements and optically stitching the patterned sub-beams they generate effectively a larger composite array can be created. This effective array has an increased surface area compared with that of each smaller array. Furthermore, the composite array can provide an increased throughput than each smaller array resulting in lower cost and more efficient operation of the lithographic machine. In one example, because of this the lithographic apparatus can be fabricated at a lower cost than a lithographic apparatus using a single array of the same effective size. This is due to the exponentially higher yield of smaller arrays of individually controllable elements.

In one example, the apparatus can further comprise a beam dividing system arranged to divide the beam into a plurality of portions and to direct each portion to a respective one of the arrays.

In one example, the combining system and dividing system comprise a common system of components (e.g., optical components, such as prisms, lenses, mirrors, other reflectors). This can reduce the total number of components in the apparatus and reduce its overall size/footprint.

In one example, the combining system and dividing system comprise a common element, such as a prism, and which can also be described as a common device, the common element being arranged to divide the beam into a plurality of portions for direction to the patterning system and to combine a corresponding plurality of patterned portions from the patterning system into the patterned beam.

In one example, the combining system and dividing system can share a plurality of such common elements, each common element being arranged to divide at least a portion of the beam into a plurality of portions for direction to the patterning system and to combine a corresponding plurality of patterned portions from the patterning system into the patterned beam.

In one example, the combining system can comprise a plurality of beam combining elements (e.g., prisms) arranged as a branching network, the network being arranged to receive the patterned beam portions from the arrays of elements, to combine the patterned portions, and to output the patterned beam.

In one example, the beam dividing system can comprise a single beam combining element, such as a prism, or a plurality of such devices. In certain examples, the dividing system comprises a plurality of beam dividing elements arranged as a branching network, the network being arranged to receive the beam, to divide the beam into a plurality of portions, and to direct each portion to a respective one of the arrays.

The projection system can comprise an array of lenses arranged to receive the patterned beam and focus the patterned beam onto the target portion of a substrate as a plurality of radiation spots.

Alternatively, the projection system can comprise a plurality of lens arrays, each lens array being arranged to receive and focus a respective portion of the patterned beam onto the target portion of a substrate as a corresponding plurality of radiation spots.

In various examples, the combining system can be arranged such that the patterns imparted to the cross section of at least two portions of the beam are adjacent to each other within the patterned projection, separated from each other within the patterned beam, or overlap each other within the patterned beam.

It will be appreciated that a wide variety of substrates can be processed with apparatus embodying the invention. For example, the substrate can be an FPD (Flat Panel Display) substrate, an LCD (Liquid Crystal Display) substrate, an IC (Integrated Circuit) substrate, or a wafer for an IC. Other substrates can be used.

The apparatus is not limited to processing substantially rigid substrates.

For example, the substrate can be flexible. Flexible glass or plastic substrates can be used. In certain embodiments, the substrate is a flexible substrate for an FPD (which can itself be flexible).

According to one embodiment of the present invention, there is provided a device manufacturing method comprising the following steps. Providing a substrate. Providing a beam of radiation using an illumination system. Using a patterning system to impart the beam with a pattern in its cross-section. Projecting the patterned beam of radiation onto a target portion of the substrate. The patterning system comprises at least two arrays of individually controllable elements. Illuminating each array with a respective portion of the beam. Using each array to impart the respective beam portion with a pattern in its cross section. Using a combining system to combine the patterned portions into the patterned beam.

The method can further comprise the step of using abeam dividing system to divide the beam into a plurality of portions and to direct each portion to a respective one of the arrays.

It will be appreciated that although the combining system and/or the dividing system can comprise one or more prisms, other forms of beam directing/reflecting elements or components can be used in embodiments of the invention.

It will also be appreciated that a prism is just one convenient form of providing two reflecting surfaces (for splitting a beam and/or for combining beam portions) with a narrow apex region in between. Alternatively, this function could be performed by a pair of mirrors, for example in embodiments with non-overlapping arrays in which a narrow apex region is not required.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
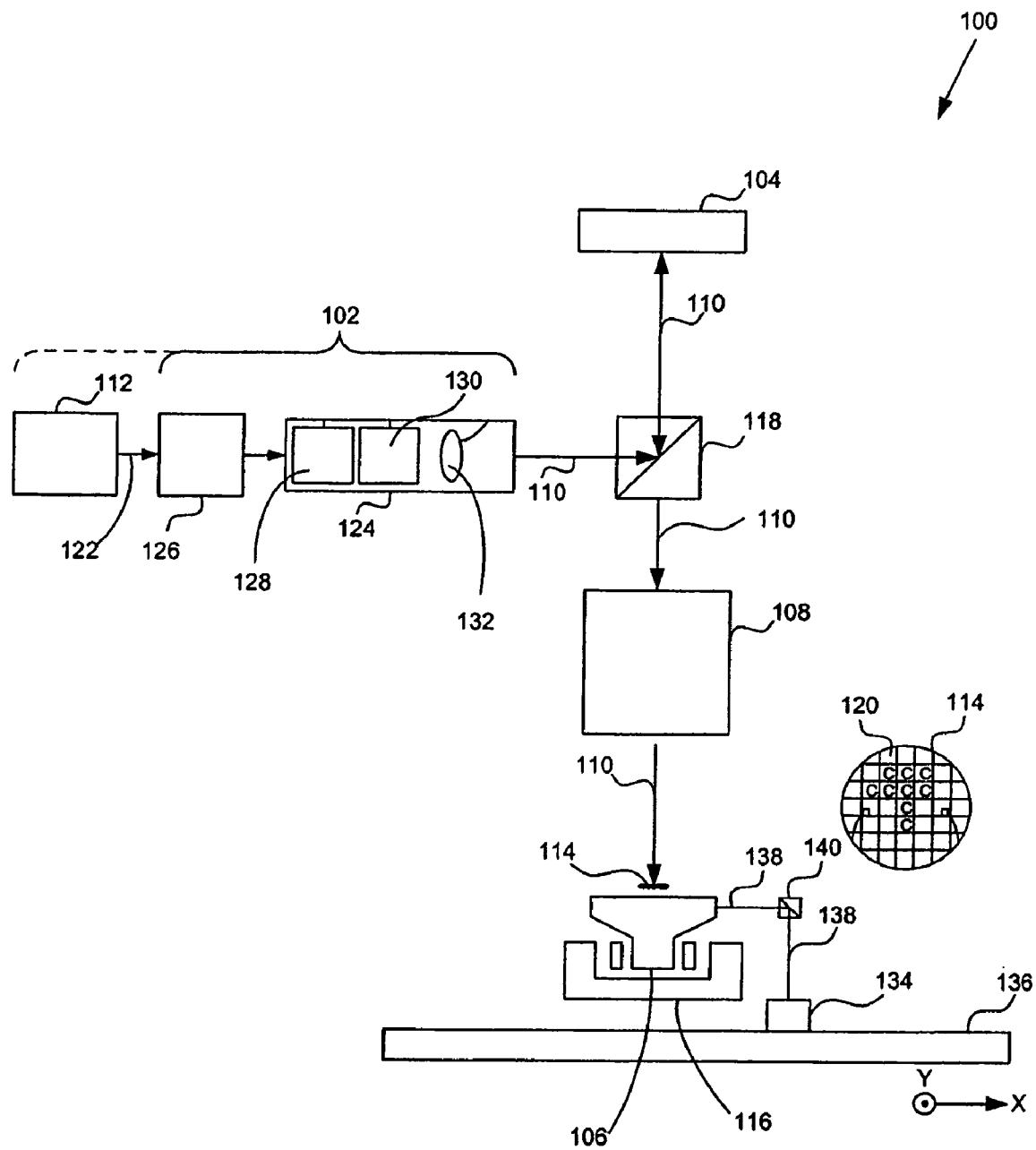
FIG. 1 depicts a lithographic apparatus, according to one embodiment of the present invention.

FIGS. 7, 8, 9, and 10 depict a pattern imparted in a cross section of a beam, according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

The term "display" used in this specification be understood to encompass both rigid and flexible displays and display devices.

The term "array of individually controllable elements" as here employed should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, e.g., addressed areas of the reflective surface reflect incident light as diffracted light, while unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical micro-electro-mechanical system (MEMS) devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference.

A programmable LCD array can also be used. An example of such a construction is given in U.S. Pat. No. 5,229,872, which is incorporated herein by reference.

It should be appreciated that where pre-biasing of features, optical proximity correction features, phase variation techniques, and multiple exposure techniques are used. For example, the pattern "displayed" on the array of individually controllable elements can differ substantially from the pattern eventually transferred to a layer of or on the substrate. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat panel displays, thin-film magnetic heads, micro and non fluid devices, etc. The skilled artisan will appreciate that, in the context of such alternative applications, any use of the terms "wafer" or "die" herein can be considered as synonymous with the more general terms "substrate" or "target portion," respectively.

The substrate referred to herein can be processed, before or after exposure, in, for example, a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein can be considered as synonymous with the more general term "projection system".

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (dual stage) or more substrate tables (and/or two or more mask tables). In such "multiple stage" machines the additional tables can be used in parallel, or preparatory steps can be carried out on one or more tables, while one or more other tables are being used for exposure.

The lithographic apparatus can also be of a type wherein the substrate is immersed in a liquid having a relatively high refractive index, e.g. water, so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate.

The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

In another example, the invention can take the form of a computer program containing one or more sequences of machine-readable instructions describing a method as disclosed above, or a data storage medium (e.g., semiconductor memory, magnetic or optical disk) having such a computer program stored therein.

EXEMPLARY EMBODIMENT

FIG. 1 schematically depicts a lithographic projection apparatus 100 according to an embodiment of the invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. The construction of the patterning system will be expanded upon in greater detail with reference to FIGS. 4 and 5. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or CaF$_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., a frequency tripled Nd:YAG laser in pixel grid imaging mode or an excimer laser in other modes) can produce a beam of radiation 122. Beam 122 is fed into an illumination system (e.g., illuminator) 124, either directly or after having traversed conditioning device 126, such as a beam expander, for example.

In one example, when apparatus 100 is operating in a pixel grid imaging mode, illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

In another example, when apparatus 100 is operating in other modes, illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2:
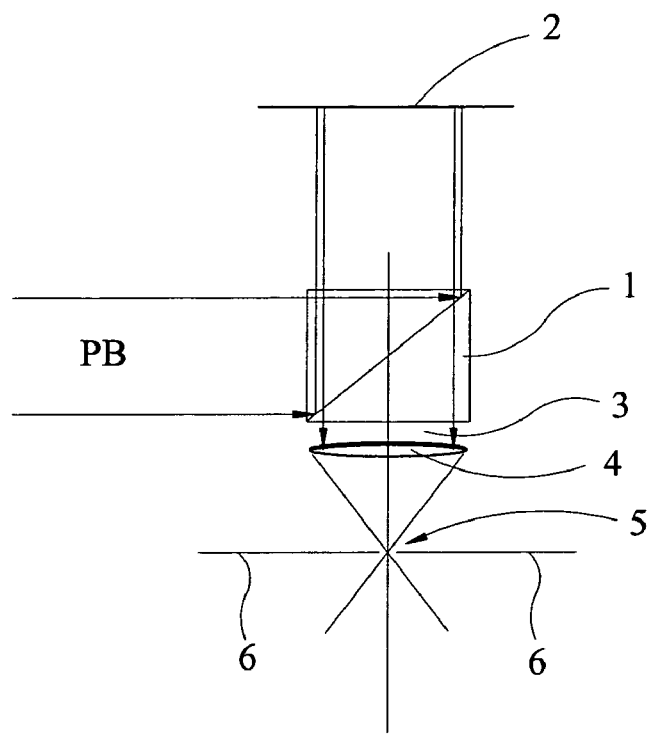
FIG. 2 depicts part of a lithographic, according to one embodiment of the present invention.

FIG. 2 depicts part of a lithographic, according to one embodiment of the present invention. This illustrates part of a lithographic apparatus including a patterning device 2 and useful for understanding the present invention. A beam PB from an illumination system (not shown) is incident upon a beam splitter 1. The beam splitter 1 is arranged to split the beam approximately in half by reflecting one half upwards towards component 2 and allowing one half to pass through the beam splitter 1. It will be appreciated that the proportions of transmitted and reflected light can vary from 50%, such that the proportion of intensity of beam that is incident upon component 2 can vary. However, in this example, and indeed in certain embodiments of the present invention, the beam is arranged to pass through the beam splitter twice, once being reflected and once transmitted. By arranging for the reflection/transmission ratio to be approximately 1:1 the proportion of the beam that emerges from the beam splitter 1 after the second pass is maximized.

Component 2 is an array of individually controllable elements. The array of individually controllable elements 2 is arranged to selectively reflect (or alternatively diffract or transmit) the beam back towards the beam splitter 1. Array 2 imparts the beam with a pattern in its cross section. The now patterned beam passes back through the beam splitter 1 (with some of the beam reflected back towards the illumination system). The patterned beam 3 passes through lens 4, which forms part of a projection system (not shown), and is focused towards aperture 5.

FIG. 2 depicts the array of individually controllable elements in a specular or ON condition. In the ON condition, all of the incident beam PB is reflected such that it passes through aperture 5. It will be appreciated that, depending upon the pattern that the array 2 is arranged to produce, portions of the patterned beam 3 will pass through the aperture 5, and portions will be incident upon a surround 6 of the aperture 5 and be absorbed, or reflected away. Portions of the patterned beam incident upon the surround 6 play no further part in the lithographic apparatus. Alternatively, the beam can be made to pass the aperture when the mirrors are in the OFF position and to be intercepted by the aperture when they are in the ON position. This can allow for specularly reflected light from "dead" surfaces not reaching the substrate to create so-called "flare" intensity on the substrate.

Figure 3:
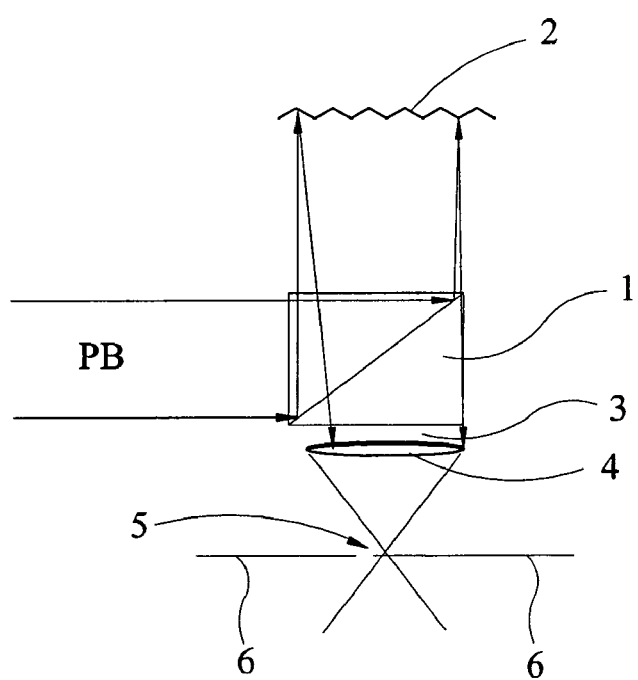
FIG. 3 depicts the part of the lithographic apparatus of FIG. 2 in an alternative configuration, according to one embodiment of the present invention.

FIG. 3 depicts the part of the lithographic apparatus of FIG. 2 in an alternative configuration, according to one embodiment of the present invention. In FIG. 3, the array of individually controllable elements 2 is in an OFF condition. The whole of the patterned beam 3 is incident upon the surround 6 of the aperture 5 such that none of the beam is incident upon the surface of a substrate.

In one example, when increasing the size of a surface area of an array of individually controllable elements, optically stitching a number of sub-beams with patterns imparted in their cross sections by a plurality of separate, smaller arrays of individually controllable elements is performed.

Figure 4:
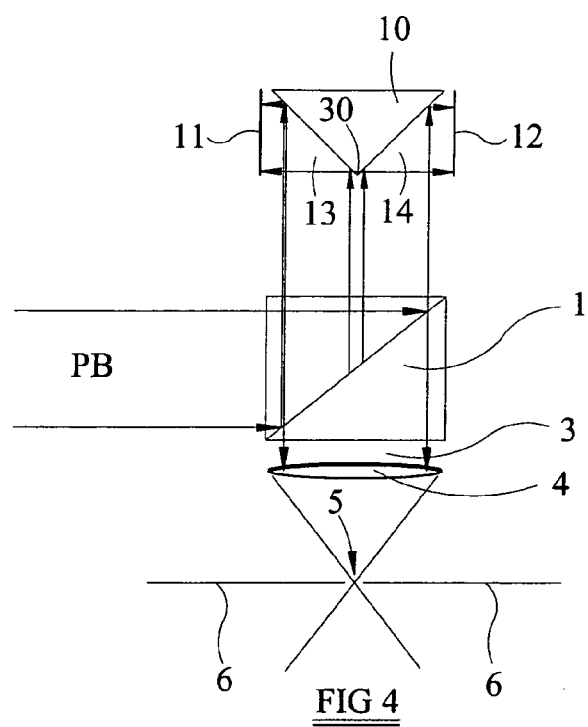
FIGS. 4 and 5 depict part of a lithographic apparatus, according to embodiments of the present invention.
Figure 5:
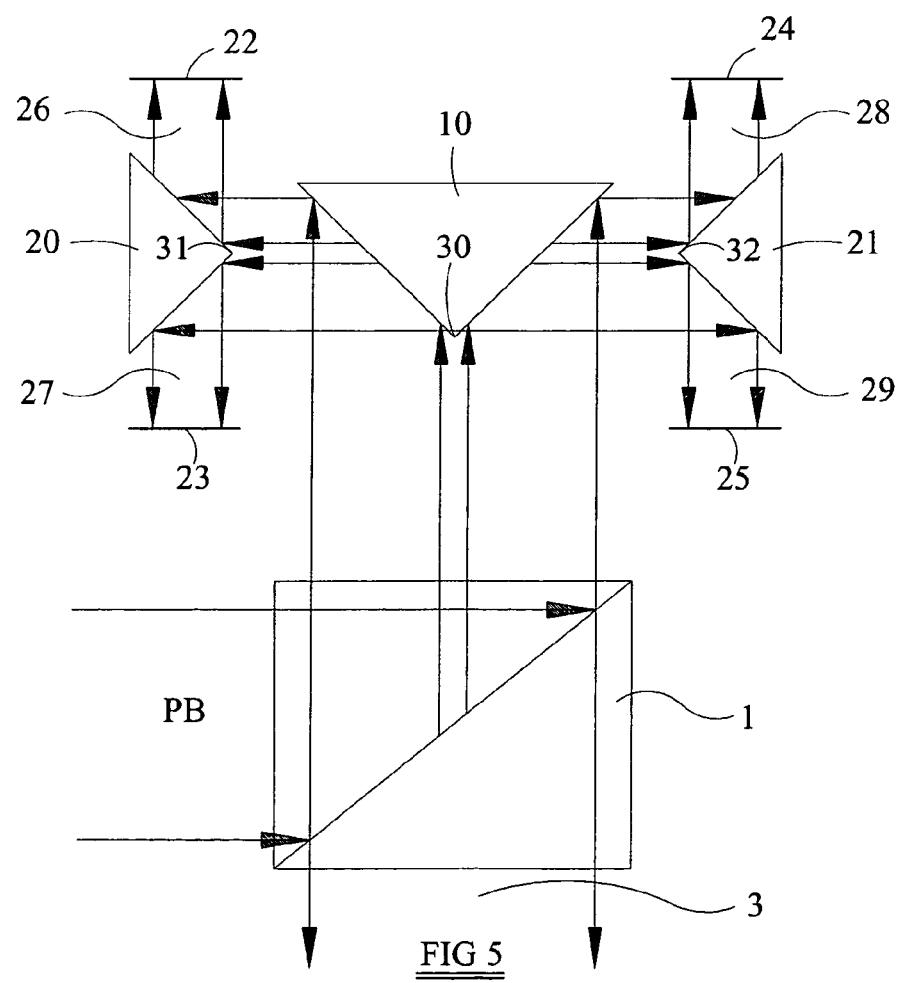

FIGS. 4 and 5 depict part of a lithographic apparatus, according to embodiments of the present invention.

In the example of FIG. 4, the beam PB is reflected towards a patterning system (not shown) by the beam splitter 1. However, instead of being incident on a single array of individually controllable elements, the reflected beam is incident upon a beam divider 10. Beam divider 10 in this example is a prism arranged to split the beam PB into two portions.

The two portions of the beam PB are separately reflected by the beam divider 10, such that they are separately incident upon and illuminate two arrays of individually controllable elements 11, 12 that comprise the patterning system. The two arrays of elements 11, 12 can be of the same general type as the array 2 shown in FIG. 2, or they can be of any other type described above. Each array of elements 11, 12 thus patterns a respective portion of the beam PB. In other words, each array generates a respective reflected sub-beam 13, 14 with a pattern imparted in its cross section. Sub-beams 13, 14 are reflected back towards the beams splitter 1 by the beam divider 10. As such, beam divider 10 constitutes a combining means (i.e., a combining system). The combining means serves to optically stitch the two sub-beams 13, 14 back into a single patterned beam 3. The patterned beam 3 continues through beam splitter 1, lens 4 and aperture 5 as described for FIG. 2.

Arrays of individually controllable elements 11 and 12 effectively combine to form a single composite array having twice the number of elements (otherwise referred to as cells together with any associated drive electronics). In this embodiment, the two sub-beams 13, 14 are combined such that the patterns imparted in their cross sections are adjacent in the patterned beam 3. This has the advantage of increasing the area of substrate W that can be exposed at once by the lithographic apparatus.

With reference now to FIG. 5, in this embodiment portions of the beam PB reflected by a first beam divider 10 are further divided into smaller portions by additional beam dividers 20, 21 of the same general type as beam divider 10. This results in four portions of the beam being incident upon, and separately illuminating, four arrays of individually controllable elements 22–25. The four arrays generate four sub beams 26–29 each having a pattern imparted in its cross section. In this embodiment, all three beam dividers 10, 20, 21 comprise the combining means for reassembling the patterned beam 3.

In one example, the pattern imparted to the cross section of the patterned beam 3 comprises a number of adjacent patterns corresponding to the patterns imparted to the cross section of each sub-beam. These are effectively "stitched" together along the apex 30, 31, 32 of each beam divider 10, 20, 21. The apex of each beam divider therefore comprises a join portion. It can be readily be seen that part of the beam PB incident upon the join portion and part of each sub-beam incident upon the join portion can be reflected out of the desired beam path. This can result in a degraded composite patterned beam 3, effectively having a "seam" along the join. Typically the apex of each prism is arranged to be at 90°, though other angles can also be used.

Figure 6:
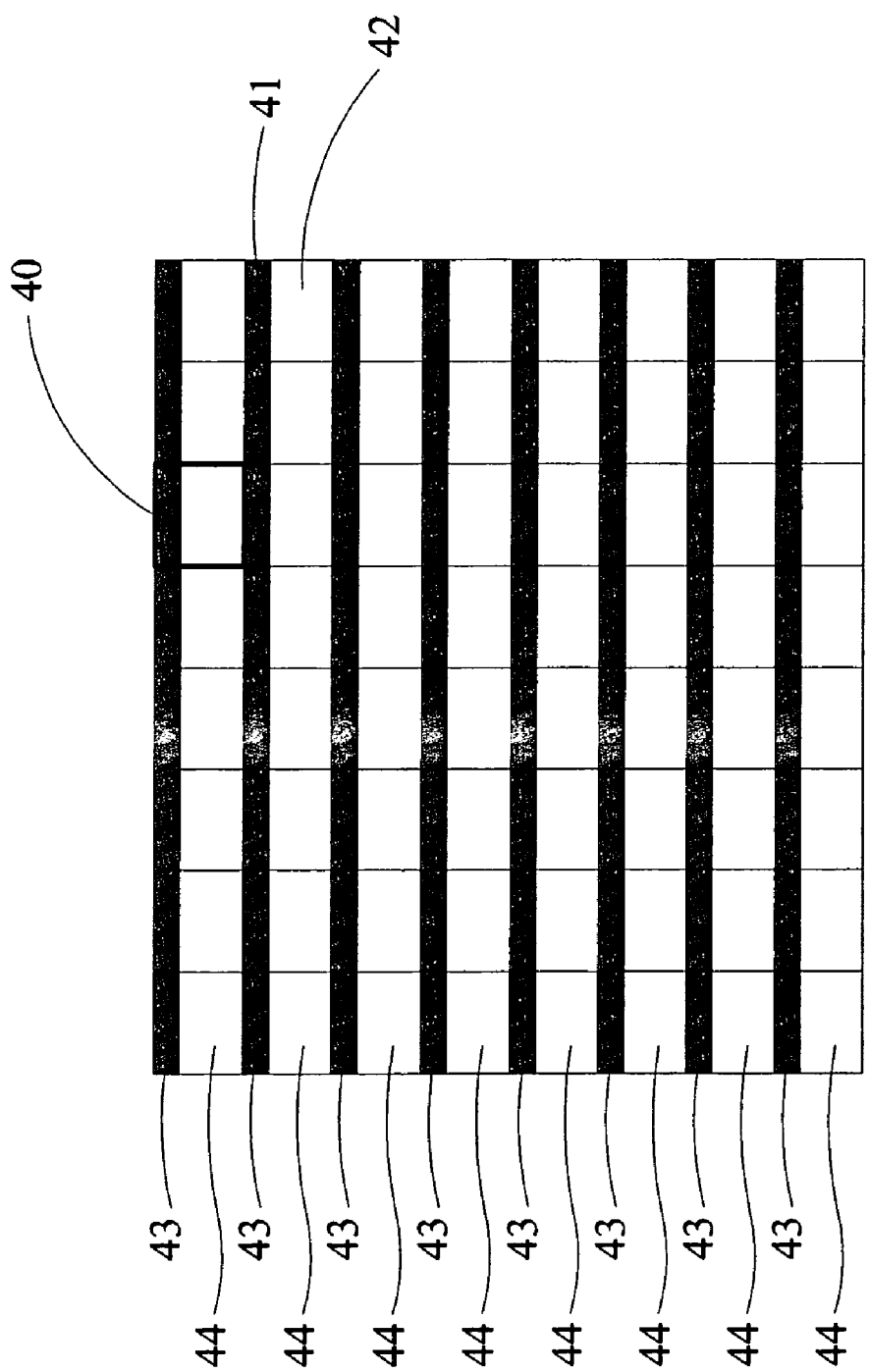
FIG. 6 depicts an array of individually controllable elements, according to one embodiment of the present invention.

FIG. 6 depicts an array of individually controllable elements, according to one embodiment of the present invention. As described above, arrays of individually controllable elements, in particular diffractive elements, can be sparse. FIG. 6 illustrates one example of a sparse array of individually controllable elements. Each cell 40 comprises an optically active portion 41 (one or more individually controllable elements, e.g., a diffractive portion of the array) and an optically dead portion 42 (e.g., the drive electronics). Cells 40 are arranged in rows, such that the array comprises interspersed optically active stripes 43 and optically dead stripes 44. The pattern imparted to a sub-beam reflected from such an array comprises redundant stripes corresponding to the optically dead stripes 44. In one example, degradation of the patterned beam 3 for a lithographic apparatus using such sparse arrays can be avoided by careful alignment of the arrays such that the portions of the sub-beams incident upon the join portions of each beam divider correspond to optically dead stripes 44. As long as the width of each join portion is narrower than the width of an optically dead stripe 44 then none of the desired pattern will be lost.

In one example, the patterned beam is a composite of the individually patterned sub-beams generated by each array of individually controllable elements. The cross section of each sub-beam can be regarded as comprising an array of beamlets. Each beamlet corresponds to an single, or group, of individually controllable elements within an array of individually controllable elements.

In various examples, the projection system PL includes an array of lenses (alternatively referred to as a micro lens array—MLA). Each beamlet within the patterned beam can be arranged to be incident upon a single lens within the array of lenses, such that each beamlet is separately focused to form a respective radiation spot on the target portion of the substrate.

FIGS. 7, 8, 9, and 10 depict a pattern imparted in a cross section of a beam, according to various embodiments of the present invention. These figures illustrate a number of alternative arrangements for the patterns imparted in the cross section of a pair of sub-beams within the composite patterned beam. It will be appreciated that these illustrated arrangements are merely exemplary and other alternative arrangements for optically stitching together sub-beams can be used in accordance with the lithographic apparatus and method of the present invention.

For clarity, a box 50 delineates each patterned sub-beam. It will be further appreciated that although each patterned sub-beam is shown as a 7×7 array of beamlets 51, the arrays of individually controllable elements corresponding to the array of beamlets 51 can be much larger. Furthermore, the alternative arrangements depicted in FIGS. 7 to 10 can be used in combination, such that the composite patterned beam can comprise a plurality of patterned sub-beams, with each pair of sub-beams having varying spatial arrangements. Also, it will be apparent that the patterns in FIGS. 7–10 are also representative of the patterns of radiation spots that can be projected onto a target portion of a substrate in various embodiments of the invention.

Figure 7:
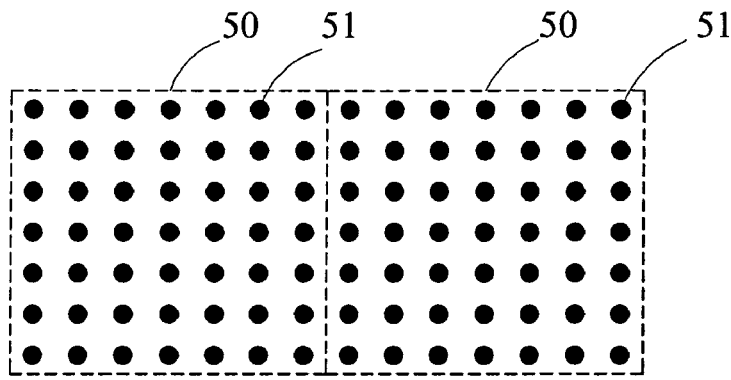

FIG. 7 shows two patterned sub-beams 50 arranged to be adjacent within the patterned beam. As such the beamlets 51 effectively combine to form a contiguous regular array. This arrangement can be particularly advantageous for increasing the total area of the effective array of individually controllable elements, such that a larger surface area of the substrate can be exposed at once. Exact alignment of the arrays can be achieved by accurate positioning of the arrays of elements and the beam divider/combining means (which can also be referred to as a beam dividing and combining system. As discussed above, there can be a join portion or seam between the two arrays of beamlets (not explicitly shown in FIG. 7). However, if the arrays of elements are sparse, it is possible to ensure that the seam does not impact on the accuracy of the patterned beam as optically active portions of the arrays of elements are not coincident with the seam.

Figure 8:
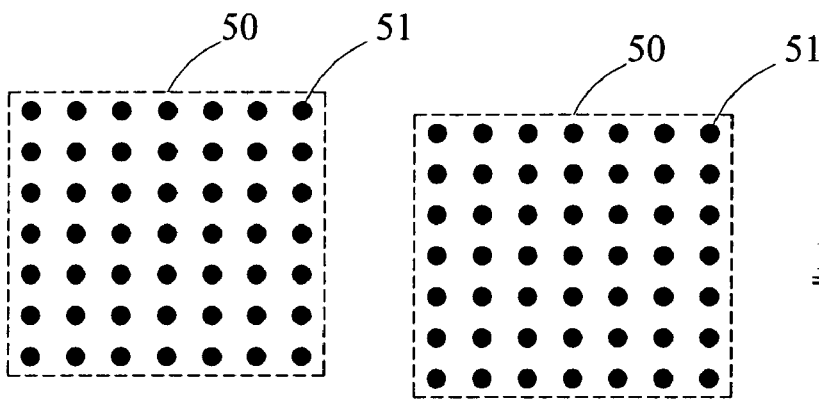

FIG. 8 shows two patterned sub-beams arranged to be spaced apart in the patterned beam. This can be desirable for dense arrays of elements, such that no light reflected from optically active portions is lost at the join portion of the beam divider. FIG. 8 shows the two patterned sub-beams 50 being spaced apart from each other in the X direction by a whole multiple of the pitch length (the average distance between a pair of beamlets within the array). In the Y direction the arrays of beamlets 50 are offset by a fraction of the pitch length. By doing this, the patterned beam is interlaced, such that when used to expose a substrate, in particular for a scanning mode lithographic apparatus, increased resolution of the exposed pattern is achieved. It will be appreciated that the arrays of beamlets 50 can be spaced apart by a whole multiple of the pitch length in either or both of the X and Y directions, and can be offset by a fraction of a pitch length in either or both of the X and Y directions. Depending upon the degree of separation, each array of beamlets 50 can be imaged on to the substrate by the same or separate arrays of lenses. In other words, the entire patterned beam can be projected onto the target substrate via a single, common MLA, or alternatively the projection system can comprise a plurality of separate MLAs, each one projecting a respective portion of the patterned beam (that portion corresponding to one of the arrays of elements of the patterning system).

Figure 9:
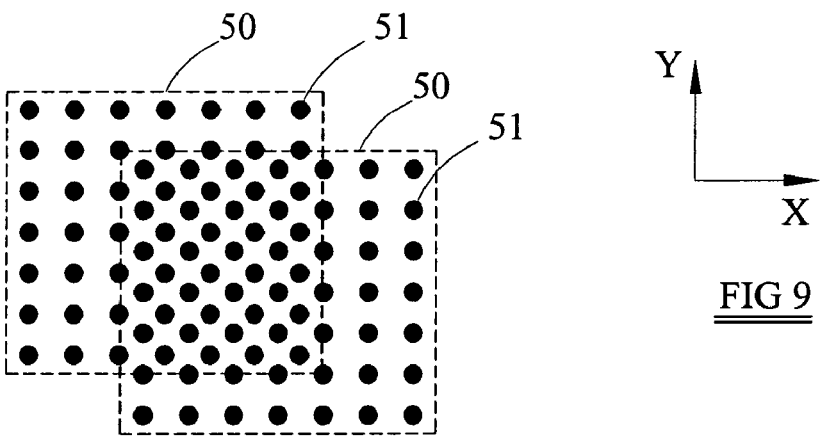

FIG. 9 shows two arrays of beamlets 50 arranged to partially overlap.

As in FIG. 8, the two arrays are also offset, in this example in both the X and Y directions. The arrangement of FIG. 9 can allow for increasing the resolution of the patterned beam. It will be appreciated that to achieve the arrangement of FIG. 9 can require modifications to the beam dividers/combing device depicted in FIGS. 4 and 5.

Figure 10:
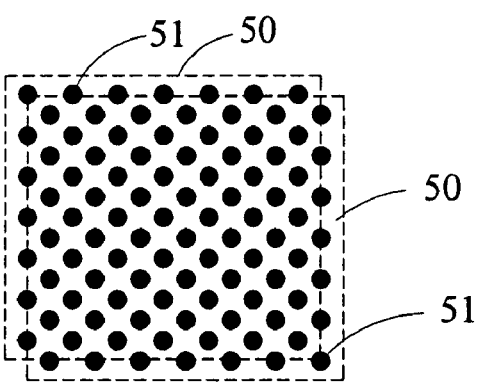

FIG. 10 shows two arrays of beamlets 50 arranged to overlap substantially completely. An advantage of overlapping the arrays of beamlets substantially completely is that one can perform compensation for dead pixels in the first array by using the second array, and vice versa (i.e., the first array can be used to provide dead-pixel compensation for dead pixels in the second array.)

For any of FIGS. 7 to 10, separate arrays of lenses can be used to focus the beamlets 51 within the patterned beam. Alternatively, a single array of lenses can be used. For the latter option the pitch of the lenses in the array of lenses can limit the degree by which the various patterned sub-beams can be offset.

In one example, when each array of individually controllable elements is illuminated by the beam PB, in order to avoid imaging the optically dead portions of the array, the beam can be patterned, such that only optically active portions are illuminated. The beam can be considered to be focused on the optically active portions.

In various examples, the beam PB supplied by the illumination system IL and used to illuminate the arrays of individually controllable elements can be a telecentric or collimated beam. Alternatively, the beam focused onto each array of elements can be arranged to arrive at a slight angle.

In various examples, each time the beam is divided into two or more portions the portions can be approximately equal, or the or each beam divider can split the beam into uneven portions. The number of portions each beam divider splits the beam into is dependent upon the geometry of the prism or other device. For instance, by having a four-sided pyramid prism a beam divider can split the beam into four portions. The beam divider can alternatively, for example, comprise one or mirrors. Alternatively, the beam divider can comprise any other suitable optical device known in the art.

In one example, the combining system for assembling the composite patterned beam can comprise the beam dividing system. It will be apparent that the beam dividing system and the combining system can share one or more optical components (elements), or alternatively can be completely separate from one another.

In various examples, each array of individually controllable elements can comprise an array of diffractive or reflective elements. Alternatively, each array can operate as a transmissive array. The pattern imparted to the cross section of each sub-beam varies according to the state of each element within the corresponding array of elements. The state of each element can vary depending upon a control signal supplied to the element, or generated by drive electronics associated with the element.

Although in FIGS. 4 and 5 the beam combining/dividing elements are prisms, it will be apparent that in alternative embodiments, different types of elements can be used, e.g., mirrors.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
   an illumination system that supplies a beam of radiation;
   a dividing system configured to divide the beam of radiation into portions;
   a patterning system that comprises at least two arrays of individually controllable elements arranged to be illuminated by the respective portions of the beam, each of the arrays patterning the respective portion of the beam;
   a combining system configured to combine the patterned portions of the beam into a patterned beam;
   a directing device that directs each of the portions between (a) the dividing system and respective ones of the at least two arrays of individually controllable elements and (b) the respective ones of the at least two arrays of individually controllable elements and the combining system; and
   a projection system that projects the patterned beam onto a target portion of a substrate.

2. The apparatus of claim 1, wherein the combining system, the directing device, and the dividing system are a combined system.

3. The apparatus of claim 1, wherein the combining system and the dividing system comprise a common element, the common element being arranged to divide the beam into the portions for direction to the patterning system and to combine the patterned portions from the patterning system into the patterned beam.

4. The apparatus of claim 3, wherein the common element comprises a prism.

5. The apparatus of claim 1, wherein the combining system and the dividing system comprise a plurality of common elements, each common element in the plurality of common elements arranged to divide at least a portion of the beam into the portions for direction to the patterning system and to combine the patterned portions from the patterning system into the patterned beam.

6. The apparatus of claim 5, wherein each common element comprise a prism.

7. The apparatus of 1, wherein the dividing system comprises at least one prism.

8. The apparatus of claim 1, wherein the dividing system comprises:
   a plurality of beam dividing elements arranged as a branching network, the branching network being arranged to receive the beam, to divide the beam into the portions, and to direct each of the portions to a respective one of the arrays.

9. The apparatus of claim 8, wherein each beam dividing element comprises a prism.

10. The apparatus of claim 1, wherein the combining system comprises at least one prism.

11. The apparatus of claim 1, wherein the combining system comprises:
a plurality of beam combining elements arranged as a branching network, the branching network being arranged to receive the patterned beam portions from the arrays of elements, to combine the patterned portions, and to output the patterned beam.

12. The apparatus of claim 11, wherein each beam combining element comprises a prism.

13. The apparatus of claim 1, wherein the projection system comprises:
an array of lenses arranged to receive the patterned beam and focus the patterned beam onto the target portion of the substrate as a plurality of radiation spots.

14. The apparatus of claim 1, wherein the projection system comprises:
a plurality of lens arrays, each of lens arrays in the plurality of lens arrays being arranged to receive and focus a respective portion of the patterned beam onto the target portion of the substrate as a corresponding plurality of radiation spots.

15. The apparatus of claim 1, wherein the combining system is arranged such that the patterns imparted to at least two portions of the beam are adjacent to each other within the patterned beam.

16. The apparatus of claim 1, wherein the combining system is arranged such that the patterns imparted to at least two portions of the beam are separated from each other within the patterned beam.

17. The apparatus of claim 1, wherein the combining system is arranged such that the patterns imparted to at least two portions of the beam overlap each other within the patterned beam.

18. The apparatus of claim 1, wherein the substrate is an FPD substrate.

19. The apparatus of claim 1, wherein the substrate is an LCD substrate.

20. The apparatus of claim 1, wherein the substrate is an IC substrate.

21. The apparatus of claim 1, wherein the substrate is a wafer for an IC.

22. A device manufacturing method, comprising:
dividing a beam of radiation into portions using a dividing device;
directing the portions onto first and second corresponding arrays of individually controllable elements using a directing device;
patterning respective ones of the portions with the first and second corresponding arrays of individually controllable elements;
directing the patterned portions towards a combining device using the directing device;
combining the patterned portions into a patterned beam using the combining device; and
projecting the patterned beam onto a target portion of a substrate.

* * * * *